United States Patent [19]

Ohshima et al.

[11] Patent Number: 5,068,865
[45] Date of Patent: Nov. 26, 1991

[54] SEMICONDUCTOR LASER MODULE

[75] Inventors: Yasunobu Ohshima; Naoki Shibanuma, both of Tokyo, Japan

[73] Assignee: NEC Corporation, Tokyo, Japan

[21] Appl. No.: 363,737

[22] Filed: Jun. 9, 1989

[30] Foreign Application Priority Data

Jun. 9, 1988 [JP] Japan ............... 63-142961
Jun. 20, 1988 [JP] Japan ............... 63-152763

[51] Int. Cl.[5] ............... H01S 3/043; G02B 6/42
[52] U.S. Cl. ............... 372/36; 385/34; 385/51
[58] Field of Search ............... 350/96.15, 96.20; 372/36; 219/121.63, 121.64; 250/227.11

[56] References Cited

U.S. PATENT DOCUMENTS

| | | | |
|---|---|---|---|
| 4,399,541 | 8/1983 | Kovats et al. | 372/36 |
| 4,523,802 | 6/1985 | Sakaguchi et al. | 350/96.12 |
| 4,623,220 | 11/1986 | Grabbe et al. | 350/96.20 |
| 4,708,429 | 11/1987 | Clark et al. | 350/96.20 |
| 4,752,109 | 6/1988 | Gordon et al. | 350/96.20 |

Primary Examiner—Frank Gonzalez
Attorney, Agent, or Firm—Sughrue, Mion, Zinn, Macpeak & Seas

[57] ABSTRACT

A semiconductor laser module comprises a semiconductor laser device, an optical fiber, and a lens for coupling light emitted from the semiconductor laser device to the optical fiber. There is provided a metal base having a flat portion and a pipe portion in a metal case. The semiconductor laser device is mounted on a chip carrier which is mounted on the flat portion of the metal base. The lens is fixed in the inside of the pipe portion of the metal base. The optical fiber is protected at one end by a ferrule which is fixed to the pipe portion of the metal base. A device such as a monitor photodiode and a thermistor may be mounted on the flat portion of the metal base. The flat portion of the metal base may be formed with a concave portion of an area smaller than an area of the bottom of the chip carrier. The chip carrier is soldered to the flat portion of the metal base by a low temperature solder to provide thermal connection therebetween, and by a spot welding at a point other than the soldered portion of the low temperature solder.

4 Claims, 6 Drawing Sheets

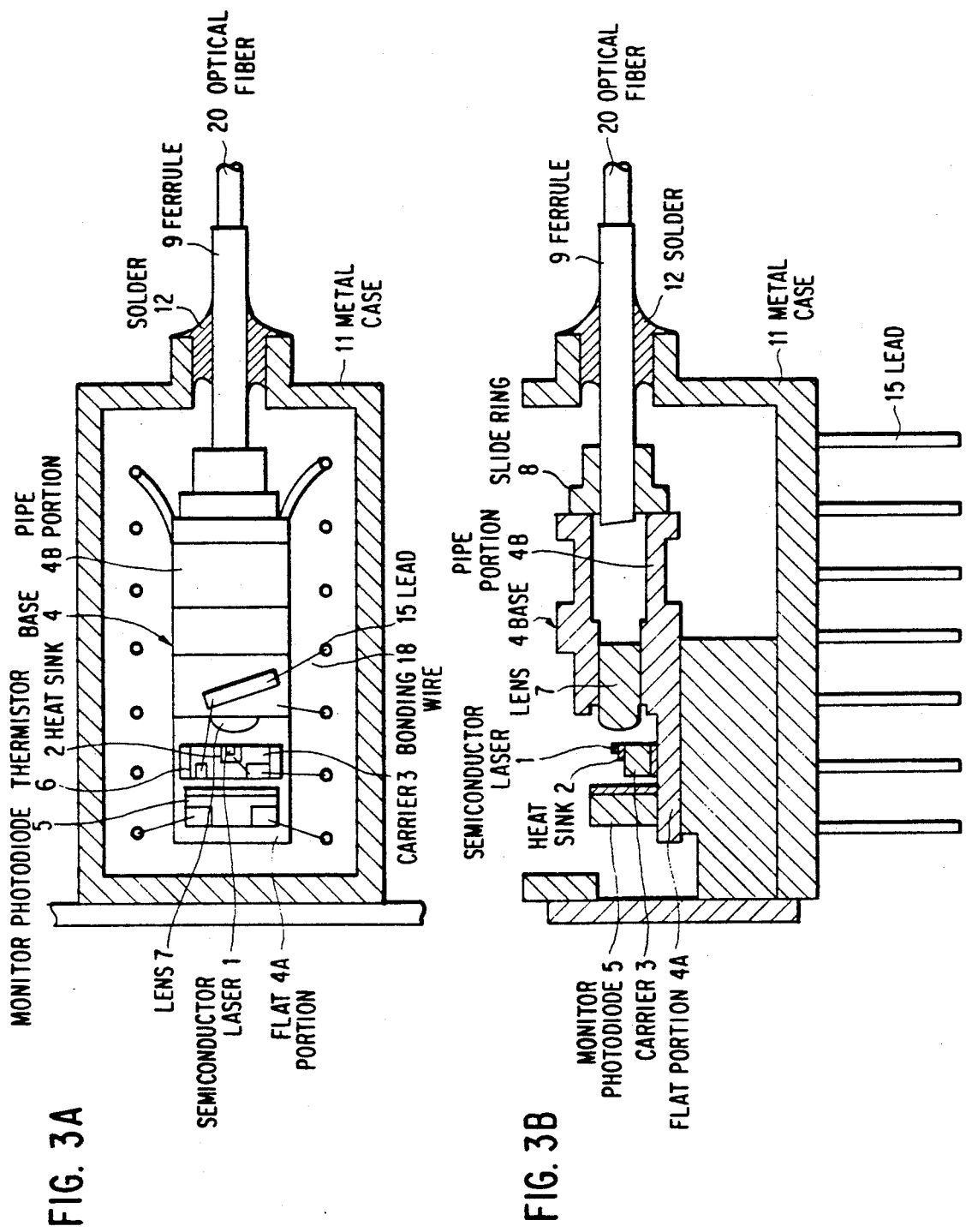

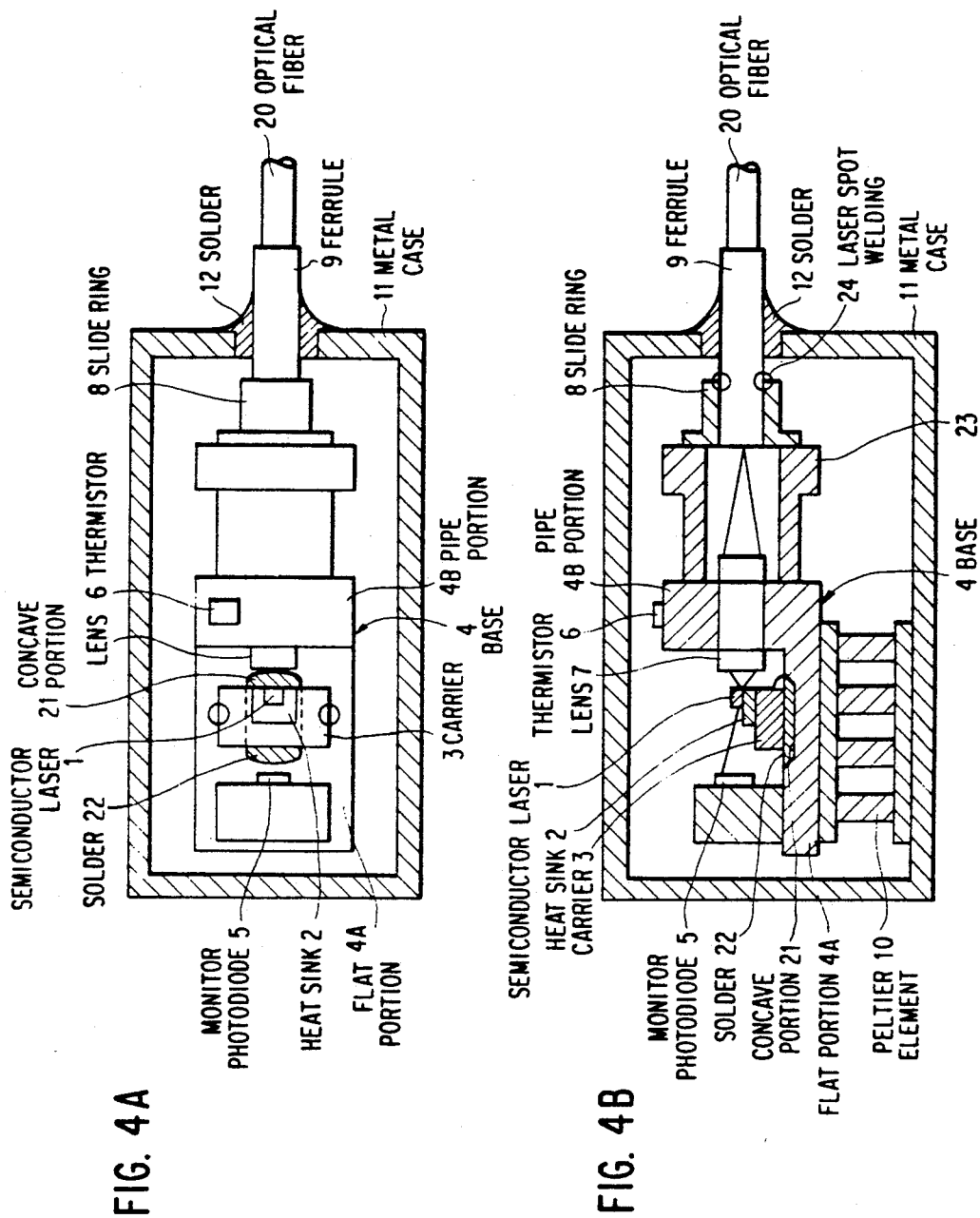

SEMICONDUCTOR LASER MODULE

FIELD OF THE INVENTION

The invention relates to a semiconductor laser module, and more particularly to an apparatus for coupling light emitted from a laser device to an optical fiber.

BACKGROUND OF THE INVENTION

A semiconductor laser module comprises a semiconductor laser diode for emitting light of a predetermined wavelength, an optical fiber for transmitting the light to a following stage, and a rod lens for coupling the light emitted from the laser diode to the input end of the optical fiber, and is used, for example, as a light source in an optical communication system. In such a semiconductor laser module, the following characteristics are required (1) An output light of a semiconductor laser diode is effectively coupled to an optical fiber.
(2) The coupling efficiency of the output light does not fluctuate dependent on such factors as the change of temperature, the deterioration of time (secular variation), the vibration of the module, the mechanical impact applied to the module.
(3) The semiconductor laser diode and other elements are air-tight sealed to stand a predetermined air-proof test.
(4) Light is not reflected from proximate ends of the rod lens, the optical fiber and so on back to the semiconductor laser diode.

Although an optical fiber communication technology has been primarily applied to a trunk line system of a communication network at an initial stage, the technology is now expanded to be applied to a branch line systems such as a subscriber system. In such an application, the semiconductor laser module is required to have a higher performance in various properties.

One type of a conventional semiconductor laser module has been proposed in the Japanese Utility Model provisional publication (Kokai) No. 62-157171. In the semiconductor laser module, a semiconductor laser diode is mounted on a stem similar in shape to a can-case. The stem is fixed to a lens holder having a rod lens in the inside thereof. The lens holder is fixed at its tip portion to a ferrule for protecting an optical fiber by providing a slide ring between them. For this structure, an output light of the semiconductor laser is coupled to the optical fiber. The semiconductor laser module will be explained in more detail later.

According to the conventional semiconductor module, however, there are disadvantages that bonding wire are difficult to connect to the laser diode, and the length of the bonding wires becomes long, because the laser diode is mounted on the inner bottom surface of the can-case. There are further disadvantages in conventional semiconductor module designs. High speed operation is difficult to carry out, because bonding wires are long. The precision of a temperature measurement of the laser diode is lowered, because a thermistor is provided behind the bottom of the can-case. There is a still further disadvantage that the alignment of the laser diode and the rod lens is difficult on a light axis of the output light, because the laser diode is mounted at a predetermined position on the bottom of the can-case which is orthogonal to the light axis.

Next, a structure in which the laser diode is mounted on the stem will be discussed. In general, a semiconductor chip is first soldered to a chip carrier. Then, the semiconductor chip is screened and selected in regard to its properties. Finally, the semiconductor chip mounted on the chip carrier is fixed to the stem by use of a solder which is lower in a melting point than a solder for the chip carrier. For instance, a solder of PbSn (63/37) having a melting point of 183° C. is used for the fixing of a chip carrier having a laser diode thereon, where the laser diode is mounted on the chip carrier by use of a solder of AuSn (80/20) having a melting temperature of 283° C., so that the softening of the AuSn solder does not occur to avoid the deviation of the laser diode on the chip carrier after the fixing of the chip carrier.

According to the conventional semiconductor laser module, however, there is a disadvantage that a high reliability of an optical system is not obtained, because a plasticized deformation occurs in the PbSn solder due to a solder creep phenomenon, where a specified preserving temperature of the semiconductor laser module is set to be 85° C. That is, the solder creep phenomenon is observed under a constant load at a temperature which is much lower than a melting point of the solder.

SUMMARY OF THE INVENTION

Accordingly, it is an object of the invention to provide a semiconductor laser module in which bonding wires are not excessively long, and may be easily connected to las device.

It is a further object of the invention to provide a semiconductor laser module in which a high speed operation is expected, and the precision of a temperature measurement is increased.

It is a still further object of the invention to provide a semiconductor laser module in which an optical alignment is precisely obtained.

It is a yet still further object of the invention to provide a semiconductor laser module in which a solder creep phenomenon is avoided.

According to one feature of the invention, a semiconductor laser module comprises a semiconductor laser device provided in a metal case, an optical fiber for supplying light emitted from the laser device to a following stage, and a lens for coupling the light from the laser device to the optical fiber. In the metal case, there is provided a metal base having a flat portion and a pipe portion, wherein the laser device is mounted on the flat portion, and the lens is wholly or partially fixed in the pipe portion. The optical fiber is protected at a proximate end by a metal pipe surrounding the optical fiber, and is fixed to the pipe portion of the metal base by means of a slide ring provided over the metal pipe. The metal base is fixed in the metal case to which the metal pipe passing through the metal case is soldered.

According to another feature of the invention, a semiconductor laser module comprises a semiconductor laser device provided in a metal case, an optical fiber for supplying light emitted from the laser device to a following stage, and a lens for coupling the light from the laser device to the optical fiber. A metal base having at least a flat portion, preferably, and a pipe portion is fixed in the metal case, wherein a concave portion of a predetermined area is formed on the flat portion, and the lens is wholly or partially fixed in the pipe portion. A molten solder of an amount which is slightly greater than a volume of the concave portion is supplied to fill the concave portion, and a chip carrier on which the laser device is mounted and having an bottom area wider than the concave portion area is slid on the concave portion. In this situation, the molten solder is cooled to solder the chip carrier to the flat portion, and the chip carrier is further spot-welded at non-soldered points by use of a laser beam, an electron beam, or the like.

BRIEF DESCRIPTION OF DRAWINGS

The invention will be described in more detail in conjunction with appended drawings wherein, FIGS. 3A and 3B are a plane view and a cross-sectional view showing a semiconductor laser module in a second embodiment according to the invention, FIGS. 4A and 4B are a plane view and a cross-sectional view showing a semiconductor laser module in a third embodiment according to the invention.

DESCRIPTION OF PREFERRED EMBODIMENTS

Figure 1:
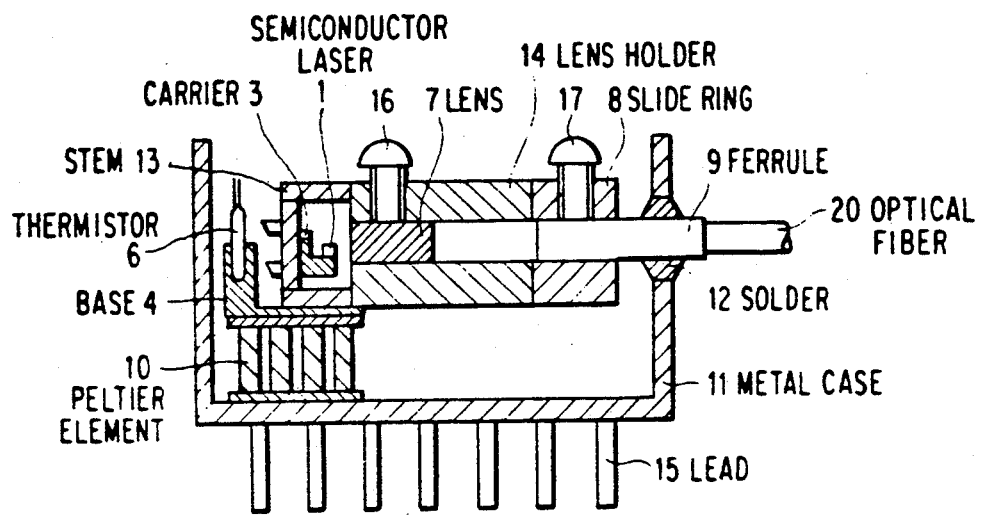
FIG. 1 is a cross-sectional view showing a conventional semiconductor laser module.

Before explaining a semiconductor laser module in a first embodiment according to the invention, the aforementioned conventional semiconductor laser module will be explained in FIG. 1. In the conventional semiconductor laser module, a laser diode 1 which is mounted on a chip carrier 3 is mounted on the inner bottom surface of a stem 13 having a shape of a can-case. The stem 13 is fixed to a lens holder 14 containing a lens 7 fixed in the inside thereof by means of a screw 16, and the lens holder 14 is fixed to a slide ring 8 fixing a ferrule 9 by means of a screw 17. The ferrule 9 protects an end of an optical fiber 20 for transmitting light supplied through the lens 7 from the laser diode 1 to a following stage. The ferrule 9 is soldered to a metal case 11 to seal therebetween by a solder 12, and the stem 13 is fixed to a metal base 4. A thermistor 6 for detecting a temperature of the laser diode 1 is provided on the metal base 4, and a Peltier element 10 for keeping the temperature of the laser diode 1 constant is provided between the metal base 4 and the bottom of the metal case 11. The laser diode 1 and the thermistor 6 are connected to corresponding leads 15 by bonding wires (not shown). The aforementioned disadvantages are not explained here.

Figure 2A:
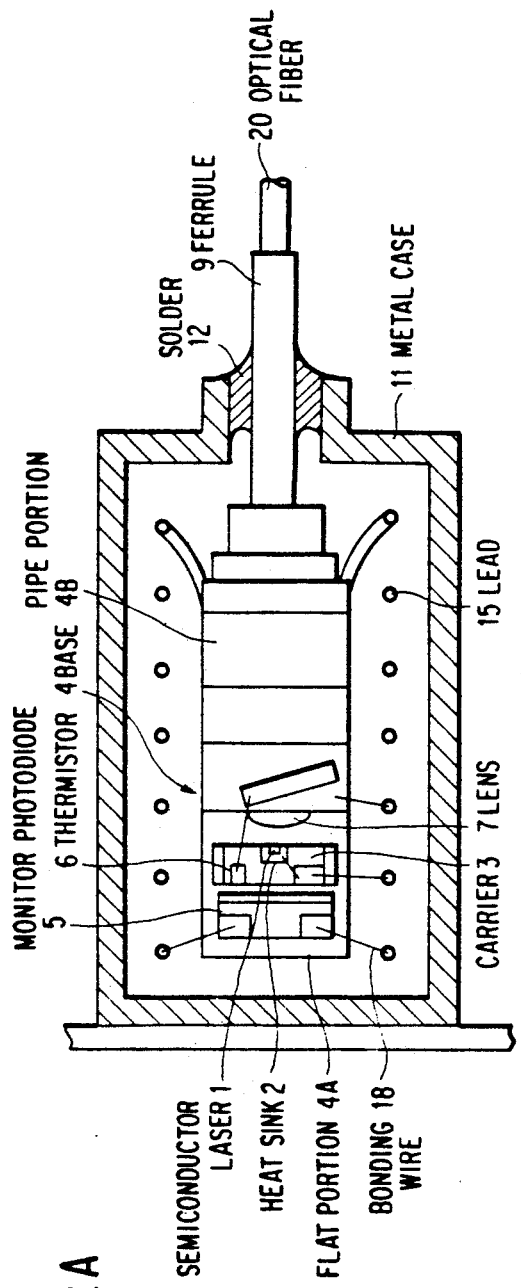
FIGS. 2A and 2B are a plane view and a cross-sectional view showing a semiconductor laser module in a first embodiment according to the invention.
Figure 2B:
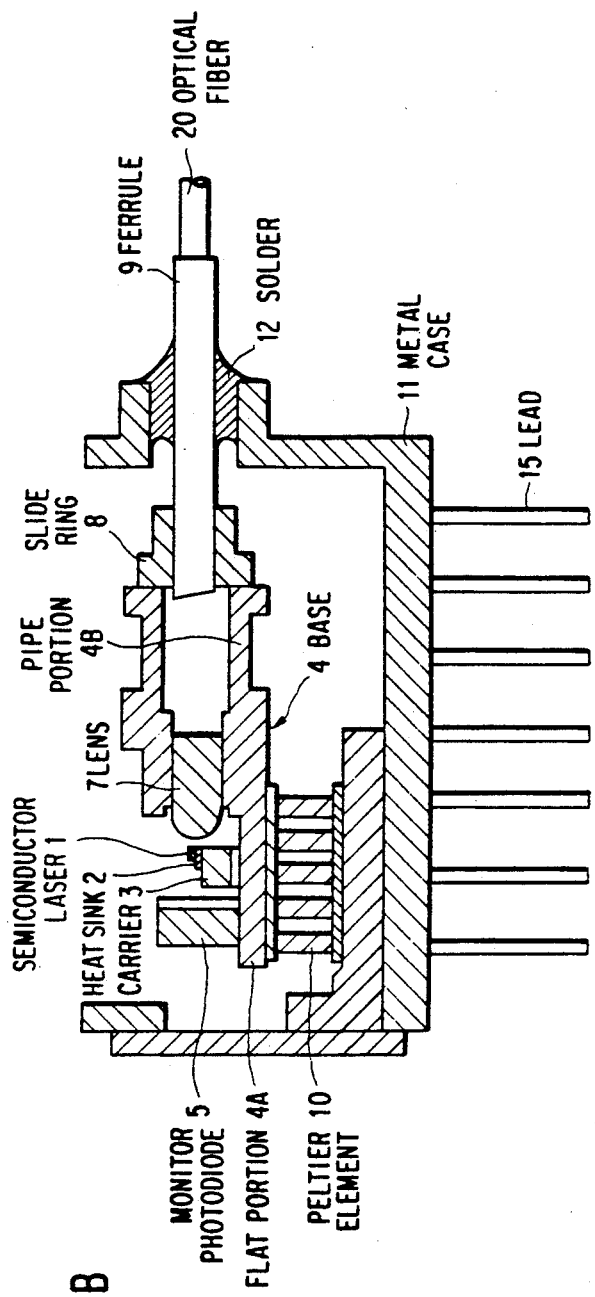

FIGS. 2A and 2B show a semiconductor laser module in the first embodiment according to the invention, wherein a metal base 4 having a flat portion 4A and a pipe portion 4B is provided in a metal case 11. In the semiconductor laser module, a laser diode 1 which is mounted on a chip carrier 3 having a heat sink 2 is mounted on the flat portion 4A of the metal base 4 together with a monitor photodiode 5, and a rod lens 7 is fixed in the inside of the pipe portion 4B of the metal base 4. A slide ring 8 fixing a ferrule 9 which protects one end of an optical fiber 20 is fixed to one side of the pipe portion 4B opposite to the other side on which the lens 7 is fixed. A Peltier element 10 is provided between the flat portion 4A of the metal base 4 and the inner bottom surface of the metal case 11, and a thermistor 6 is also provided on the flat portion 4A of the metal base 4. The laser diode 1, the monitor photodiode 5, and the thermistor 6 are connected to corresponding leads 15 by bonding wires 18, and an aperture of the metal case 11 for passing the ferrule 9 is soldered to seal therebetween by a solder 12.

In the semiconductor laser module as described above, the flat portion 4A on which the chip carrier 3 is mounted is integral in the metal base 4 with the pipe portion to which the ferrule 9 is fixed, so that light emitted from the laser diode 1 is effectively and stably coupled to the input end of the optical fiber 20. As may be clearly understood from the illustration of FIG. 2A, an ordinary wire bonding technology can be used to increase productivity, because the bonding wires 18 are connected to flat electrode surfaces of the laser diode 1 etc. and top surfaces of the leads 15. As a matter of course, a high speed operation may be carried out, because the length of the bonding wires 18 becomes short. Further, the precision of measuring a temperature of the laser diode 1 is increased, because the thermistor 6 is mounted in the vicinity of the laser diode 1 to minimize a temperature measuring error dependent on atomospheric heat.

FIGS. 3A and 3B show a semiconductor laser module in a second embodiment according to the invention, wherein like parts are indicated by like reference numerals in the first embodiment. In the second embodiment, a Peltier element 10 is not provided. Therefore, the invention may be applied to a semiconductor laser module of both a Peltier element built-in type and a non-Peltier element built-in type.

FIGS. 4A and 4B show a semiconductor laser module in a third embodiment according to the invention. In the semiconductor laser module, a rod lens 7 is soldered in the inside of a pipe portion 4B of a metal base 4, and a chip carrier 3 having a heat sink 2 on which a laser diode 1 is mounted and a monitor photodiode 5 are then mounted on a flat portion 4A of the metal base 4. A method for mounting the chip carrier 3 will be described in detail later. Thereafter, the laser diode 1 is controlled to emit light to adjust a ferrule 9 for protecting one end of an optical fiber 20 to be fixed at a most appropriate light coupling position. Thus, the ferrule 9 is soldered to a slide ring 8 in a YAG laser spot welding method as indicated by a reference numeral 24, and then fixed to an additional metal base 23 by welding the slide ring 8 to the additional metal base 23 in the YAG laser spot welding method. After that, an optical system thus fabricated is built into a metal case 11 together with a thermo-electric cooler including a Peltier element 10, and the ferrule 9 is soldered to the metal case 11 by a solder 12. A thermistor 6 is mounted on the top of the pipe portion 4B of the metal base 4 beforehand.

Figure 5A:
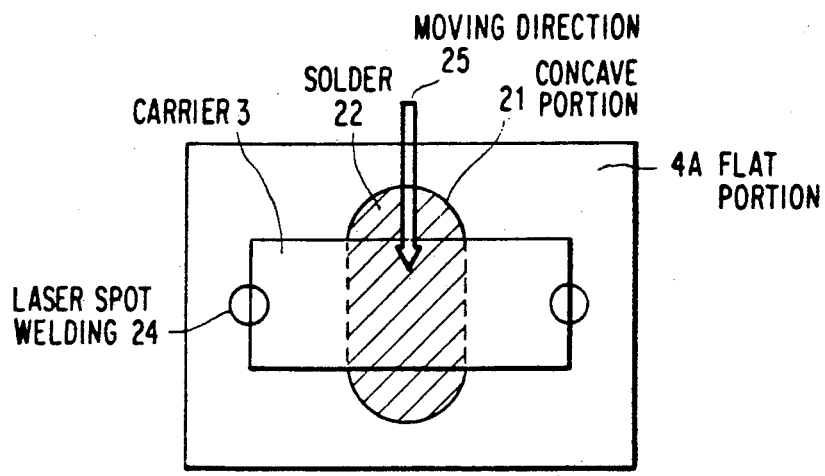
FIGS. 5A to 5C are a plane view, a front view, and a side view showing a first example in which a laser device chip carrier is soldered to a metal base in the third embodiment.
Figure 5B:
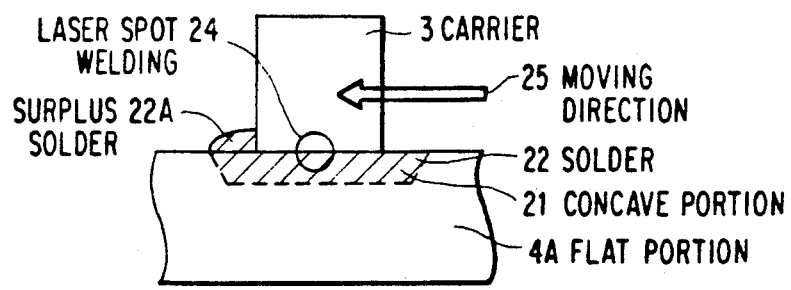
Figure 5C:
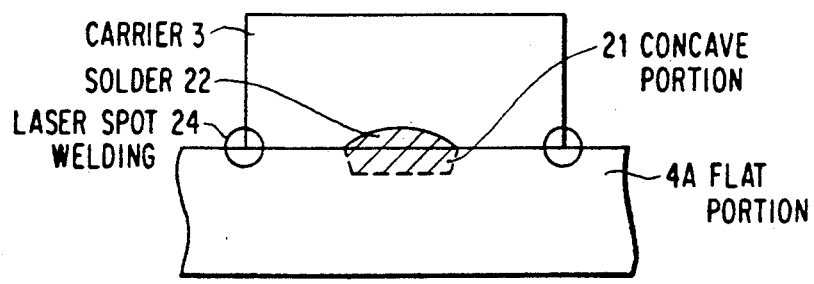

FIGS. 5A to 5C show a first method in which the chip carrier 3 is mounted on the flat portion 4A of the metal base 4.

A concave portion 21 for accumulating a molten solder 22 is formed on the flat portion 4A which is heated up to a temperature of 130° C., such that a low temperature solder such as InSn (48/52) is melted to 21. The chip carrier 3 is slid in the direction of an arrow 25 to be positioned in the center of the concave portion 21, so that the surplus solder 22A is flown in the same direction, and the flat portion 4A is cooled to solder the chip carrier 3 thereto. The laser diode 1 is mounted beforehand on the chip carrier 3 by use of a high temperature solder such as AuSn (80/20). Next, the chip carrier 3 is welded at points other than the soldered portion of the low temperature solder on the flat portion 4A in a YAG laser beam spot welding method as indicated by a reference numeral 24. The laser beam spot welding may be replaced by an electron beam welding.

Figure 6A:
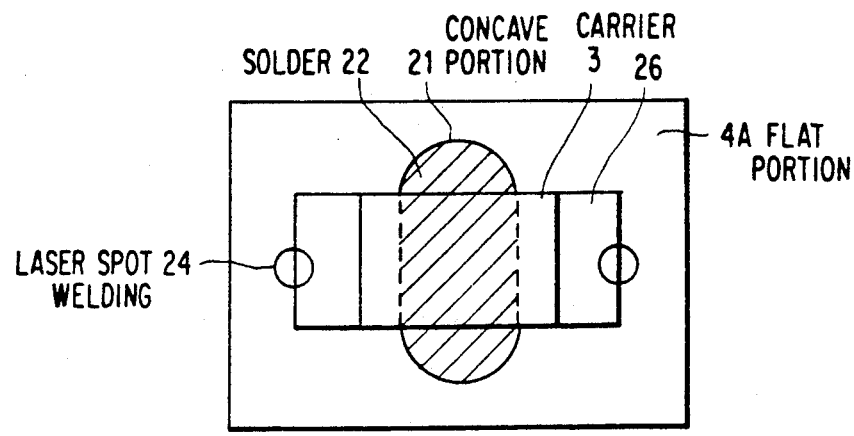
FIGS. 6A to 6C are a plane view, a front view, and a side view showing a second example in which a laser device chip carrier is soldered to a metal base in the third embodiment.
Figure 6B:
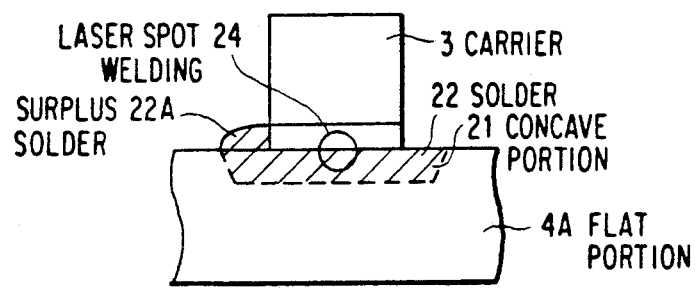
Figure 6C:
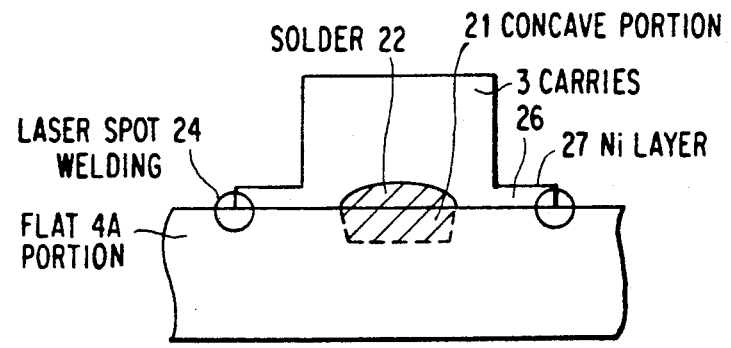

FIGS. 6A to 6C show a second method in which the chip carrier 3 is mounted on the flat portion 4B of the metal base 4. The chip carrier 3 is provided with flanges 26, so that YAG laser beam spot welding is precisely carried out. The quality of the YAG laser beam spot welding depends on a surface condition of a member to be welded and an incident angle of a laser beam, for which an absorption of the laser beam is changed. For this reason, the flanges 26 are provided on the both sides of the chip carrier 3, so that it becomes easy for the laser beam to be incident to welding surface orthogonally, thereby improving the absorption of the laser beam into the member to be welded. For instance, if Au plating layer is removed on the flanges 26 to expose Ni plating layer 27, the laser beam absorption is further improved to provide a good quality weld at an interface such as the one shown at 24.

As explained above, the YAG laser beam spot welding provides a soldering strength which is mechanically stable, because the YAG spot welding is carried out after a thermal connection is attained between the flanges 26 and the flat portion 4B by the low temperature solder. Therefore, a long term reliability for an optical system, and a good electrical characteristic are obtained in the semiconductor laser module.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A semiconductor laser module: comprising,
   a semiconductor laser device from which light of a predetermined wavelength radiates, said semiconductor laser device being mounted on a chip carrier;
   an optical fiber for supplying said light to a following stage, one end of said optical fiber being protected by a ferrule;
   a lens for coupling said light of said semiconductor laser device to an input end of said optical fiber;
   a metal base having a flat portion on which said chip carrier is mounted, and a pipe portion in the inside of which said lens is fixed on one side of said pipe portion and to which said ferrule is fixed on the other side of said pipe portion, said semiconductor laser device, said lens, and said input end of said optical fiber being aligned on an axis of said light to provide an optical system;
   a metal case in which said optical system is fixed and through a side wall of which said ferrule protecting said optical fiber is passed;
   a first means for detecting light; and
   a second means for detecting a temperature of said semiconductor laser device;
   wherein said first means is mounted on said flat portion of said metal base, and said second means is mounted on said chip carrier.

2. A semiconductor laser module: comprising,
   a semiconductor laser device from which light of a predetermined wavelength radiates, said semiconductor laser device being mounted on a chip carrier;
   an optical fiber for supplying said light to a following stage, one end of said optical fiber being protected by a ferrule;
   a lens for coupling said light of said semiconductor laser device to an input end of said optical fiber;
   a metal base having a flat portion on which said chip carrier is mounted, and a pipe portion in the inside of which said lens is fixed on one side of said pipe portion and to which said ferrule is fixed on the other side of said pipe portion, said semiconductor laser device, said lens, and said input end of said optical fiber being aligned on an axis of said light to provide an optical system; and
   a metal case in which said optical system is fixed and through a side wall of which said ferrule protecting said optical fiber is passed;
   wherein said flat portion of said metal base is formed with a concave portion, an area of said concave portion being smaller than the bottom surface area of said chip carrier, and said chip carrier being soldered to said flat portion of said metal base by a low temperature solder completely filled in said concave portion and by a spot welding at a point other than the soldered portion of said low temperature solder.

3. A semiconductor laser module: comprising,
   a semiconductor laser device from which light of a predetermined wavelength radiates, said semiconductor laser device being mounted on a chip carrier;
   an optical fiber for supplying said light to a following stage, one end of said optical fiber being protected by a ferrule;
   a lens for coupling said light of said semiconductor laser device to an input end of said optical fiber;
   a metal base on which said chip carrier is mounted;
   a lens holder for holding said lens; and
   a metal case in which said metal base, said lens holder, and said ferrule are aligned on an axis of said light to provide an optical system, and through a side wall of which said ferrule protecting said optical fiber is passed;
   wherein said metal base is formed with a concave portion, an area of said concave portion being smaller than the bottom surface area of said chip carrier, and said chip carrier being soldered to said metal base by a low temperature solder completely filled in said concave portion and by a spot welding at a point other than the soldered portion of said low temperature solder.

4. A semiconductor laser module: comprising,
   a semiconductor laser device from which light of a predetermined wavelength radiates, said semiconductor laser device being mounted on a chip carrier;
   an optical fiber for supplying said light to a following stage;
   a lens for coupling said light of said semiconductor laser device to an input end of said optical fiber;

a metal base having a flat portion on which said chip carrier is mounted, said semiconductor laser device, said lens, and said input end of said optical fiber being aligned on an axis of said light to provide an optical system; and wherein said flat portion of said metal base is formed with concave portion, an area of said concave portion being smaller than the bottom surface area of said chip carrier, and said chip carrier being soldered to said flat portion of said metal base by a low temperature solder completely filled in said concave portion and by a spot welding at a point other than the soldered portion of said low temperature solder.

* * * * *

UNITED STATES PATENT AND TRADEMARK OFFICE
CERTIFICATE OF CORRECTION

PATENT NO. : 5,068,865
DATED : Nov. 26, 1991
INVENTOR(S) : OHSHIMA et al

It is certified that error appears in the above-identified patent and that said Letters Patent is hereby corrected as shown below:

Col. 2, line 29, delete "las" and insert therefor --laser--;

Col. 4, line 65, after "to" insert --provide the molten solder 22 in the concave portion--.

Signed and Sealed this

Fourth Day of May, 1993

Attest:

MICHAEL K. KIRK

Attesting Officer    Acting Commissioner of Patents and Trademarks